US009644261B2

(12) United States Patent
Weichart et al.

(10) Patent No.: US 9,644,261 B2
(45) Date of Patent: May 9, 2017

(54) APPARATUS FOR SPUTTERING AND A METHOD OF FABRICATING A METALLIZATION STRUCTURE

(71) Applicant: Oerlikon Advanced Technologies AG, Balzers (LI)

(72) Inventors: Juergen Weichart, Balzers (LI);
Mohamed Elghazzali, Feldkirch (AT);
Stefan Bammesberger, Stuttgart (DE);
Dennis Minkoley, Chur (CH)

(73) Assignee: EVATEC ADVANCED TECHNOLOGIES AG, Balzers (LI)

( * ) Notice: Subject to any disclaimer, the term of this patent is extended or adjusted under 35 U.S.C. 154(b) by 0 days.

(21) Appl. No.: 14/181,886

(22) Filed: Feb. 17, 2014

(65) Prior Publication Data

US 2014/0158530 A1    Jun. 12, 2014

Related U.S. Application Data

(62) Division of application No. 12/417,727, filed on Apr. 3, 2009, now Pat. No. 8,691,058.
(Continued)

(51) Int. Cl.
*C23C 14/34* (2006.01)
*H01J 37/34* (2006.01)
(Continued)

(52) U.S. Cl.
CPC ........ *C23C 14/3485* (2013.01); *C23C 14/046* (2013.01); *C23C 14/0641* (2013.01);
(Continued)

(58) Field of Classification Search
CPC .................... C23C 14/345; C23C 14/3485
See application file for complete search history.

(56) References Cited

U.S. PATENT DOCUMENTS 6,193,855 B1 *   2/2001   Gopalraja ............. C23C 14/046
                                                                       204/192.12
6,200,433 B1     3/2001   Ding et al.
(Continued)

FOREIGN PATENT DOCUMENTS

JP    2001-303247 A    10/2001
JP    2004-131839 A     4/2004
(Continued)

OTHER PUBLICATIONS

Yu-Sheng Wang et al, "The Electrical Property of Plasma-treated Ta/TaNx Diffusion Barrier," Journal of Physics and Chemistry of Solids, 2007.
(Continued)

*Primary Examiner* — Jason M Berman
(74) *Attorney, Agent, or Firm* — Pearne & Gordon LLP (57) ABSTRACT

A method of depositing a metallization structure (1) comprises depositing a TaN layer (4) by applying a power supply between an anode and a target in a plurality of pulses to reactively sputter Ta from the target onto the substrate (2) to form a TaN seed layer (4). A Ta layer (5) is deposited onto the TaN seed layer (4) by applying the power supply in a plurality of pulses and applying a high-frequency signal to a pedestal supporting the substrate (2) to generate a self-bias field adjacent to the substrate (2).

7 Claims, 8 Drawing Sheets

Related U.S. Application Data (60) Provisional application No. 61/042,015, filed on Apr. 3, 2008.

(51) Int. Cl.
*C23C 14/04* (2006.01)
*C23C 14/06* (2006.01)
*C23C 14/16* (2006.01)
*C23C 14/35* (2006.01)
*H01L 21/285* (2006.01)

(52) U.S. Cl.
CPC ............ *C23C 14/165* (2013.01); *C23C 14/35* (2013.01); *H01J 37/345* (2013.01); *H01J 37/3467* (2013.01); *H01L 21/2855* (2013.01)

(56) References Cited

U.S. PATENT DOCUMENTS

| | | |
|---|---|---|
| 6,290,825 B1 | 9/2001 | Fu |
| 6,296,742 B1 | 10/2001 | Kouznetsov |
| 6,911,124 B2 | 6/2005 | Tang et al. |
| 7,253,109 B2 | 8/2007 | Ding et al. |
| 2001/0003607 A1 | 6/2001 | Gopalraja |
| 2002/0074233 A1 | 6/2002 | Ritzdorf et al. |
| 2003/0089597 A1 | 5/2003 | Tang |
| 2003/0209422 A1 | 11/2003 | Wang |
| 2008/0135400 A1 | 6/2008 | Kadlec et al. |
| 2008/0135401 A1* | 6/2008 | Kadlec ................ H01J 37/3444 204/192.13 |
| 2009/0111216 A1 | 4/2009 | Weichart et al. |

FOREIGN PATENT DOCUMENTS

| | | |
|---|---|---|
| JP | 2004-134733 A | 4/2004 |
| JP | 2004-266112 A | 9/2004 |
| WO | 02/065547 A2 | 8/2002 |
| WO | 02/091461 A2 | 11/2002 |

OTHER PUBLICATIONS

Z.L. Yuan et al, "A New Method for Deposition of Cubic Ta Diffusion Barrier for Cu Metallization," Elsevier Science B. V., 2003.
Hilke Donohue et al, "Low-resistivity PVD a-tantalum: Phase Formation and Integration in Ultra-low k Dielectric/copper Damascene Structures," Trikon Technologies.
Momtchil Stavrev et al, "Behavior of Thin Ta-based Films in the Cu/barrier/Si System," American Vacuum Society, 1999.
Hoo-Jeong Lee et al, "Thermal Stability of a Cu/Ta Multilayer: An Intriguing Interfacial Reaction," Elsevier Science Ltd, 1999.
Written Opinion for PCT/IB2009/051419 dated Jul. 7, 2009.
International Search Report for PCT/IB2009/051419 dated Jul. 7, 2009.
Korean Office action for 10-2010-7022019 dated Jun. 1, 2015.

* cited by examiner

APPARATUS FOR SPUTTERING AND A METHOD OF FABRICATING A METALLIZATION STRUCTURE

FIELD OF THE INVENTION

The present application relates to apparatus for sputtering and to a method of fabricating a metallization structure, in particular, a metallization structure for a semiconductor chip.

BACKGROUND OF THE INVENTION

Semiconductor chips face constant development aimed at increasing the performance of the circuits supported by the chips while decreasing the overall physical size of the chips. Physical limitations like power dissipation in integrated circuits (IC's) and the process technology for fabricating IC's on an ever smaller scale have recently encouraged vertically stacking a plurality of chips instead of further increasing the lateral device density to enhance performance.

Semiconductor chips which are to be vertically stacked may be fabricated to include through silicon vias to establish electrical connections between the vertically stacked semiconductor chips. The through silicon vias are typically high aspect ratio holes in the semiconductor chips that are filled or plated with a metal or conductor to electrically connect two or more layers of circuit elements.

Semiconductor chips may also be provided with a multi-level rewiring structure which typically includes a number of electrically conductive and dielectric layers fabricated on the front side of the semiconductor chip. The multi-level rewiring structure enables the integrated circuit structures fabricated in the semiconductor body to be connected to contact pads on the outermost surface of the chip. Uniform coverage of the side walls of vias extending between the different layers of the multi-layer metallization is also desirable.

Vias both as part of a multi-level rewiring structure as well as through silicon vias extending through the body of the semiconductor chip may have an aspect ratio of at least 5:1, or at least 10:1 and possibly even at least 20:1 or more in the future. Aspect ratio is used to describe the ratio of the height of the via to its width. However, high aspect ratios make it difficult to cover the side walls of the via with a layer of material which has a uniform thickness over the side walls.

Additionally, the use of copper in place of aluminum for the metallization providing the rewiring structures on the surfaces of the semiconductor chips as well as for through silicon vias may enable additional improvements in heat dissipation since copper has a resistivity which is only about half that of aluminium. However, copper has the disadvantage that it diffuses into silicon and, if this occurs, can damage the integrated circuits of the chip and impair its performance.

U.S. Pat. No. 6,911,124 B2 and U.S. Pat. No. 7,253,109 B2 disclose a structure including a lower Ta or TaNx layer, a middle TaN seed layer and an upper Ta layer which aims to prevent the diffusion of copper into the silicon substrate.

However, tantalum metal has two crystalline phases: a low resistivity (15-60 micro-ohm-cm) alpha (body centered cubic) phase and a higher resistivity (150-210 micro-ohm-cm) beta (tetragonal) phase. The alpha phase is desired over the beta phase for use as a barrier for electronic applications due to its lower resistivity. However, the deposition conditions have to be carefully controlled in order to avoid the formation of the higher resistivity beta phase.

Therefore, it is desirable to provide a metallization structure for a semiconductor chip which can be reliably deposited with a low resistivity and which is suitable for use with copper interconnects.

SUMMARY

A method of depositing a metallization structure comprises providing a substrate and depositing a TaN layer onto the substrate followed by depositing a tantalum layer onto the TaN layer. The TaN layer is deposited by providing a target formed at least in part from tantalum to be sputtered onto the substrate, supplying a sputtering gas comprising nitrogen and inert gas and applying a power supply between an anode and a cathode in a plurality of pulses, the cathode including the target. The pulsed power supply is applied with a high current and low duty cycle and, in particular, the pulses have a frequency in the range 10 Hz to 1000 Hz, a duty cycle of between 0.01% and 20% and produce a current density of between 0.1 A/cm$^2$ and 10 A/cm$^2$ on the target. A magnetic field is provided adjacent to a surface of the target. During each pulse of the power supply, tantalum is reactively sputtered from the target onto the substrate to form a TaN seed layer. The Ta layer is deposited onto the TaN seed layer by supplying an inert sputtering gas and applying a power supply between an anode and a cathode in a plurality of pulses, the cathode including the target. As by the deposition of the TaN layer, the pulsed power supply is applied with a high current and low duty cycle and, in particular, the pulses have a frequency in the range 10 Hz to 1000 Hz, a duty cycle of between 0.01% and 20% and produce a current density of between 0.1 A/cm$^2$ and 10 A/cm$^2$ on the target. Furthermore, during deposition of the Ta layer, a high-frequency signal is applied to a pedestal supporting the substrate to generate a self-bias field adjacent to the substrate. During each pulse of the power supply, tantalum is deposited from the target onto the TaN layer to form a tantalum layer.

A method of depositing a TaN/Ta barrier layer structure is provided which is suitable for use with copper interconnects and which is deposited by physical vapour deposition, in particular, sputtering and more particularly using a high current, low duty cycle pulsed sputtering technique.

A method of operating apparatus for high power impulse magnetron sputtering to fabricate a metallization structure is also provided. The apparatus comprises a pedestal for supporting a substrate during sputtering, a magnetic assembly for providing a magnetic field adjacent to a surface of a target formed at least in part from tantalum to be sputtered onto the substrate, a first power supply for applying power between an anode and a cathode in a plurality of pulses, the cathode including the target, and a second power source electrically connected to the pedestal for applying a high-frequency signal to a pedestal supporting the substrate to generate a self bias field adjacent the substrate. The pulses of the first power supply have a frequency in the range 10 Hz to 1000 Hz, a duty cycle of between 0.01% and 20% and produce a current density of between 0.1 A/cm$^2$ and 10 A/cm$^2$ on the target.

To fabricate the metallization structure, the high-frequency signal is not applied to the pedestal during deposition of a TaN seed layer. In contrast, the high-frequency signal is applied to the pedestal during deposition of a tantalum layer onto the TaN seed layer. A pulsed power supply, for example a DC voltage, is, however, applied between the anode and the cathode during the deposition of both the TaN and the Ta layer. The TaN layer is deposited by reactive sputtering using a sputtering gas comprising a proportion of nitrogen.

This method of operating apparatus for high power impulse magnetron sputtering enables an alpha-tantalum layer to be deposited on a TaN layer having a thickness of less than 5 nm and even a thickness of 1 nm and 0.2 nm. The TaN layer is reactively sputter deposited using a pulsed technique. This TaN layer deposited using this method appears to encourage the growth of alpha-Ta over beta-Ta in the overlying Ta layer and encourage the growth of a low resistivity metallization structure. The first power supply may be a DC power supply.

The invention also provides apparatus for sputtering which comprises a pedestal for supporting a substrate during sputtering, at least one target formed at least in part from electrically conductive material to be sputtered onto the substrate and a magnetic assembly for providing a magnetic field adjacent to a surface of the target. The apparatus further includes a first power supply for applying a power supply between an anode and a cathode in a plurality of pulses, the cathode including the target. The first power supply is able to supply the pulses with a frequency in the range 10 Hz to 1000 Hz, a duty cycle of between 0.01% and 20% and produce a current density of between 0.1 A/cm$^2$ and 10 A/cm$^2$ on the target. The apparatus also includes a second power source electrically connected to the pedestal for applying a high-frequency signal to a pedestal supporting the substrate to generate a self bias field adjacent the substrate. The apparatus further includes means for synchronizing the pulses of the first power supply with the high-frequency signal applied to the pedestal.

DETAILED DESCRIPTION OF THE FIGURES

Figure 1:
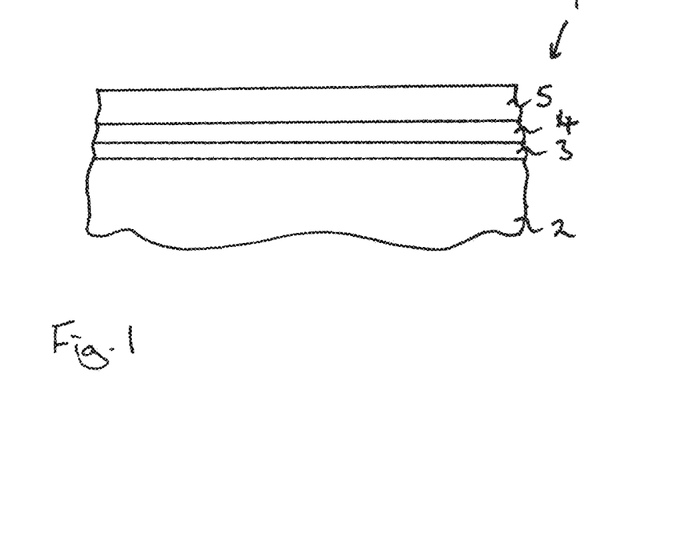
FIG. 1 illustrates a metallization structure including TaN which is reactively sputtered on the substrate and alpha-Ta which is grown on the TaN.

FIG. 1 illustrates a schematic view of a metallization structure 1 of a substrate 2 which in this embodiment is a silicon chip. The metallization structure 1 includes a $SiO_2$ layer 3 positioned on the silicon substrate 2, a TaN layer 4 positioned on the $SiO_2$ layer 3 and an alpha-tantalum layer 5 positioned on the TaN layer 4. A copper layer may be deposited onto the alpha-tantalum layer 5. The TaN layer 4 has a thickness of less than 5 nm and may have a thickness as small as 0.2 nm. The tantalum layer may have a thickness of 600 nm.

Tantalum-based thin films may be used as a diffusion barrier and adhesion layer in Cu metallization due to the chemical and thermal stability of the refractory metal and its alloys. Tantalum metal has two crystalline phases: the low resistivity (15-60 micro-ohm-cm) alpha (body centered cubic) phase and a higher resistivity (150-210 micro-ohm-cm) beta (tetragonal) phase. Due to the lower resistivity of the alpha phase, it is more desirable barrier for electronic applications compared to the beta phase.

Figure 2:
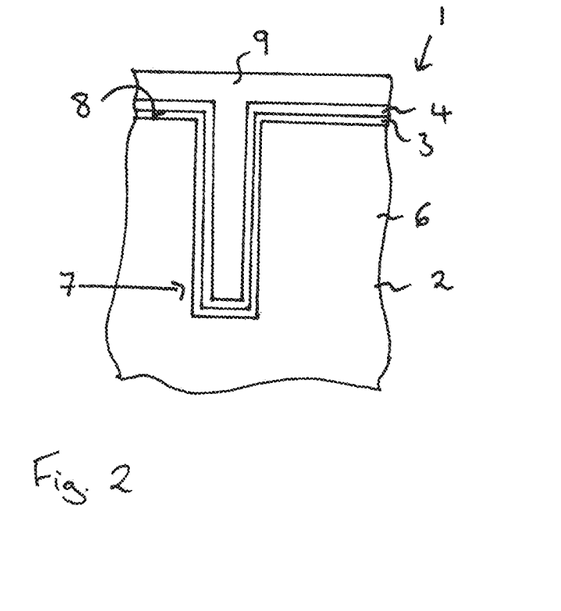
FIG. 2 illustrates the metallization structure of FIG. 1 covering the side walls of a via.

FIG. 2 illustrates a schematic view of a portion of a semiconductor wafer 6 including a via 7 which extends from the front planar surface 8. A metallization structure 1 as illustrated in FIG. 1 including a TaN layer 4 and alpha-Ta layer 5 covers the inner surfaces of the via 7 as well as the front planar surface 6. The overlying copper metallization 9 is also illustrated in FIG. 2. In some embodiments, the via 7 extends through the thickness of the silicon wafer 6 to provide a through silicon via. In some embodiments, the via 7 forms an interlevel via arranged in a dielectric layer of a multi-level rewiring structure on the front surface 8 of the silicon wafer 6. In some embodiments, the via has an aspect ratio of at least 5:1, at least 10:1 or at least 20:1.

Figure 3:
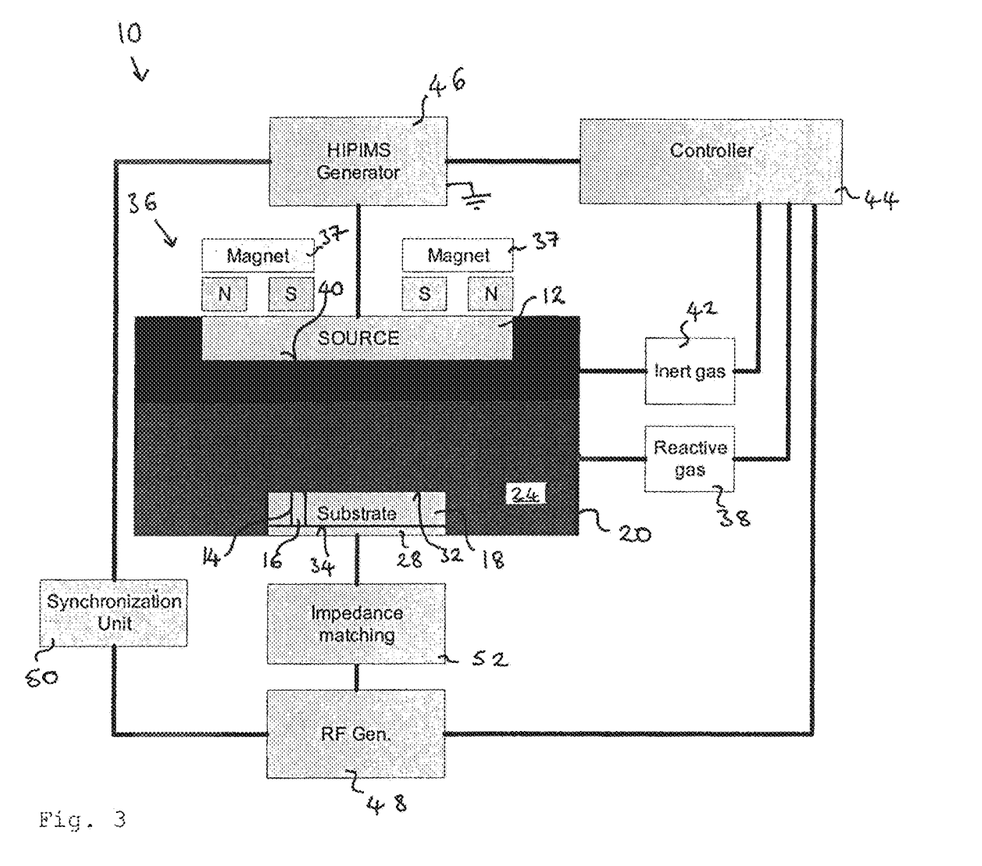
FIG. 3 illustrates a schematic diagram of apparatus suitable for fabricating the metallization structure of FIGS. 1 and 2.

The metallization structure 1 illustrated in FIGS. 1 and 2 may be fabricated using a sputtering apparatus illustrated in FIG. 3.

FIG. 3 illustrates a schematic diagram of sputtering apparatus 10 which may be used in a high-power, impulse magnetron sputtering method which is called HIPIMS (also HPPMS, High Power Pulsed Magnetron Sputtering).

The apparatus 10 also includes means to synchronize the delivery of a high frequency signal to generate a maximum self bias voltage that occurs substantially simultaneously with a maximum DC current during a DC voltage pulse. This feature is used when depositing the tantalum layer 5 of the metallization structure 1.

However, during the reactive sputter deposition of the TaN layer 4 of the metallization structure 1, a high-frequency signal is not applied. By growing the TaN layer 4 without the use of a high-frequency signal, it is found that the alpha Tantalum phase can be more reliably grown on the TaN layer 4. Furthermore, the thickness of the TaN layer can be reduced to less than 1 nm and even to 0.2 nm without the specific resistivity of the layer significantly increasing. This enables the metallization structure to be deposited reliably, quickly and therefore cost-effectively, and with a low resistivity. Furthermore, the metallization structure is suitable for copper-based rewiring structures.

A suitable apparatus and method for HIPIMS is disclosed in U.S. Ser. No. 11/954,507, U.S. Ser. No. 11/954,490 and U.S. 60/982,817, which are incorporated herein by reference in their entirety. The apparatus and method may be used for magnetically enhanced sputtering an electrically conductive material from a source or target 12 on to substantially vertical side walls 14 of through silicon vias 16 formed in a semiconductor substrate 18, such as a silicon wafer. However, the apparatus and method of operating the apparatus may also be used to deposit the structure on a planar surface or as part of a rewiring metallization or multi-level rewiring system of a semiconductor chip.

Figure 4:
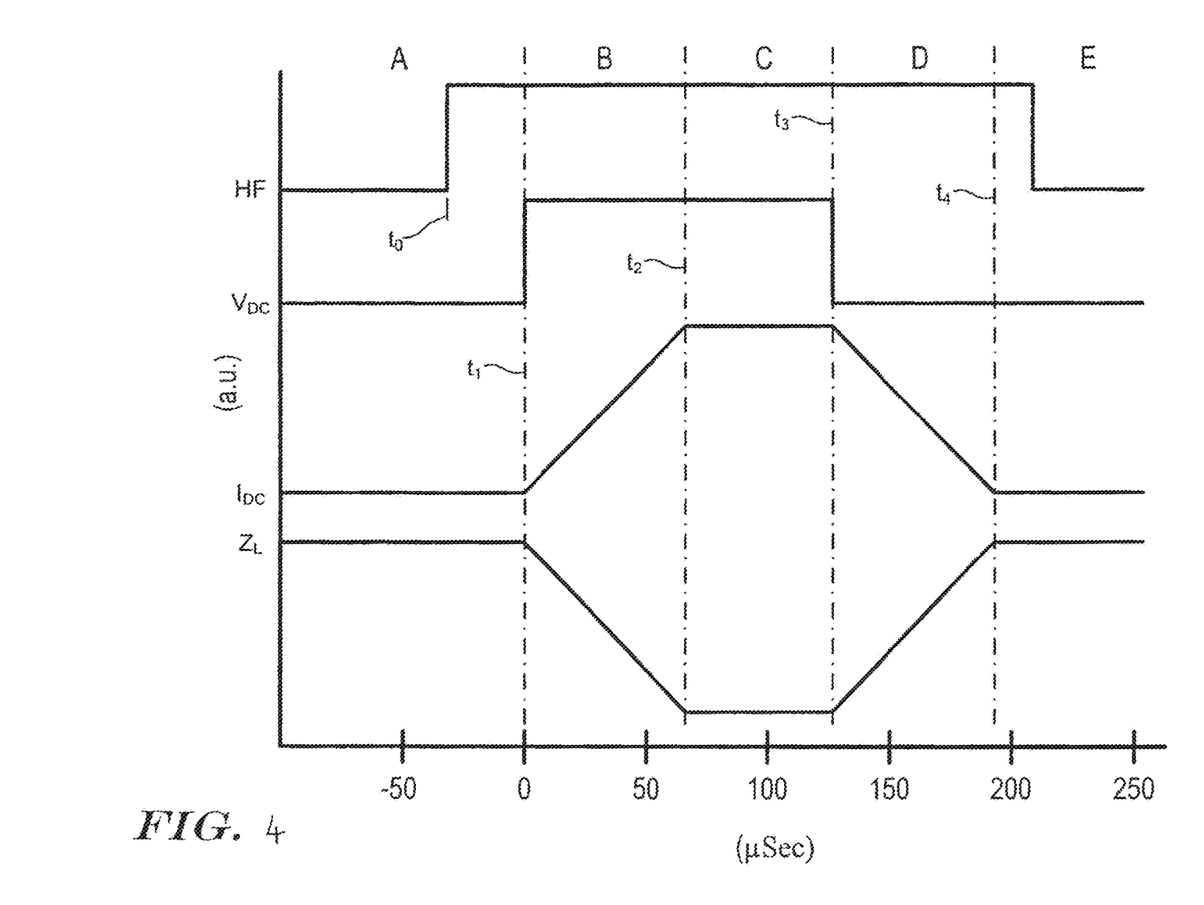
FIG. 4 illustrates a method of controlling the apparatus of FIG. 3 used to deposit the tantalum layer of the metallization structure of FIGS. 1 and 2.

In the HIPIMS technique, pulsed plasma of very short pulses with very high power, for example, up to several Megawatts, with a low duty cycle, for example, between 0.01% to 10% are applied to achieve a very high metal vapour ionization of more than 90%. Besides improved film properties, HIPIMS allows directional sputtering onto three-dimensional features due to the fact that the ionized metal can be accelerated by electric fields. This advantage can be used to more uniformly coat the inner surfaces of vias including vias having a high aspect ration of at least 10:1. Apparatus suitable for carrying out HIPIMS is illustrated in FIGS. 3 and 4.

The apparatus 10 includes a reactor housing 20 defining a substantially enclosed chamber 24 in which deposition of the electrically conductive material onto the semiconductor substrate 18 is to take place. A pedestal 28 fabricated from electrically conductive material such as a metal or an alloy, for example, is exposed to, and optionally extends at least partly into the chamber 24 to support the semiconductor substrate 18 at an appropriate position within the chamber 24 during sputter deposition operations.

The semiconductor substrate 18 is a substantially planar silicon wafer having a top planar surface 32 and a bottom planar surface 34 resting on the pedestal 28 within the chamber 24. The vias 16 formed in the semiconductor substrate 18 can be open at the top planar surface 32 and closed by the bottom planar surface 30 to form a closed-end generally U-shaped cross-section that extends partially into the semiconductor substrate 18 along the depth dimension D. Side walls 14 define the interior periphery of the via 16. The side walls 14 extend to the depth D into the semiconductor substrate 18 relative to the with w of the via 16 to give the via 16 what is commonly referred to as an aspect ratio of at least 10 to 1. Aspect ratios are expressed here in as a ratio of the depth of the via 16 to the width of the via 16.

The apparatus 10 includes a magnet assembly 36 including a plurality of rotatable permanent magnets 37 adjacent to an exposed surface 40 of the target 12 which is, in this embodiment, formed of tantalum, the electrically conductive material to be sputter deposited onto the substrate 18 including the interior surfaces of the via 16 such as the side walls 14 and base of the via 16. The magnetic field generated by the magnetic assembly 36 provides a plasma near, or optionally on the exposed surface 40 of the target 12.

A reactive sputtering gas, such as $N_2$, is supplied from a gas source 38 and an inert gas, such as argon, is supplied from gas source 42 and metered into the chamber 24 through a mass flow controller which is operatively connected to controller 44.

The apparatus 10 further includes a HIPIMS generator 46 comprising a DC power supply electrically connected to the target 12 across a ground and a negatively biased cathode including the target 12. The plasma is initiated by flowing a gas into the chamber 24 and igniting it into a plasma by selectively applying the DC voltage.

The apparatus 10 further includes a rf power source 48 electrically connected to the pedestal 28 to apply a high frequency signal to the pedestal 28 and generate a DC self bias field adjacent to the semiconductor substrate 18 supported on the pedestal 28 during sputtering operations. The DC self bias field is effective to accelerate ions of the electrically conductive material ejected from the target 12 in the direction perpendicular to the substrate 18, thus promoting sputtering of the electrically conductive material onto the side walls 14 of the via 16 having high aspect ratios of at least 10:1. The high-frequency signal may have a frequency within a range of 1 MHz to 70 MHz, for example.

The apparatus may optionally further include a frequency tuner for adjusting frequency of the high frequency signal from the rf power supply 48.

The high frequency signal applied to the pedestal 28 and the pulses of the DC power supply 46 applied across the ground and the target 12 may be synchronized with one another by synchronizing unit 50.

To fabricate the metallization structure 1 illustrated in FIGS. 1 and 2, the TaN layer 4 is deposited by reactive sputtering using the apparatus 10 to supply power in a plurality of pulses across the ground and target 12 which has a high-current and low duty cycle. A pulsed power supply, in particular a pulsed DC voltage is applied between the anode 57 and the target 12 to remove tantalum from the target 12. This tantalum is able to react with the nitrogen sputtering gas so that a TaN layer 4 is deposited onto the substrate. However, during deposition of the TaN 4 layer, the high-frequency signal is not applied.

During sputtering of the overlying Tantalum layer 5, the high-frequency signal is applied to the pedestal 28 and synchronized with the pulsed DC voltage as illustrated in FIG. 3.

FIG. 4 illustrates a method of sputtering using apparatus 10 for depositing the tantalum layer 5. FIG. 4 illustrates, as a function of time, the voltage $V_{DC}$ established across the ground and target 12, the high frequency signal applied to the pedestal 28, HF, the dc current $I_{DC}$, and the variable plasma impedance portion of the overall load across which the pulse of the DC voltage is applied by the DC power supply is depicted by waveform $Z_L$.

In summary, the transmission of the high frequency signal HF to the pedestal 28 begins before application of the DC voltage pulse, continues during the application of the DC voltage pulse, and ends after the DC voltage pulse is discontinued. The high frequency signal is said to be substantially simultaneously delivered to the pedestal 28 for the entire duration of the DC voltage pulse applied across the ground and target 12. The pulse of the dc voltage applied between t1 and t3 may have a duration of around 130 microseconds for example. A plurality of the DC voltage pulses and high frequency pulses delivered to the pedestal 28 are repeatedly applied to sputter material from the target 12 onto the side walls 14 of the via 16.

In more detail, in region A of the graph illustrated in FIG. 4, the dc voltage is initially not established across the anode and target 12 by HIPIMS generator 46, which in this embodiment is a dc power supply, and the high frequency signal is not initially being delivered to the pedestal 28. Therefore, there is little, if any, plasma ignited within the chamber 24 and any such plasma is the low density plasma with relatively high impedance.

Prior to the establishment of the pulse of the dc voltage from the dc power supply 46 across the anode and target 12, delivery of the high frequency signal from the variable RF supply 48 to the pedestal 28 is initiated at a time $t_0$. The waveform HF in FIG. 4 depicts the power of the high frequency signal from the RF power supply 48. Delivery of the high frequency signal to the substrate 18 generates a self biased field above the substrate 18.

Subsequent to time $t_0$, the pulse of the dc voltage from the dc power supply 46 is applied at $t_1$, shown as zero seconds along the abscissa in FIG. 4, across the anode and target 12 to ignite the plasma in chamber 24. The dc voltage applied by the dc power supply 56 is depicted in FIG. 4 as $V_{DC}$.

The dc current supplied by the dc power supply 46 increases from the value at time $t_1$ over time due at least in part to the increasing plasma density and, accordingly, falling impedance of plasma, until it reaches a maximum at the time $t_2$. The increasing dc current is depicted by waveform $I_x$ in FIG. 4. The variable plasma impedance portion of the overall load across which the pulse of dc voltage is applied by the dc voltage power supply 46 is depicted, in FIG. 4, by waveform $Z_L$.

Both the pulse of dc voltage from the dc power supply 46 and the high frequency signal from the RF power supply 48 are supplied throughout period C of the pulse cycle illustrated in FIG. 4 until, at time $t_3$, the dc voltage from the dc power supply 46 ceases to be applied across the anode or ground and target 12.

Accordingly, the dc current gradually decreases from its maximum and approaches the dc current that existed prior to application of the dc for voltage pulse. At time $t_3$, however, when the dc voltage is discontinued, the high frequency signal is still being delivered to the pedestal 28 from the RF power supply 48.

A plurality of dc voltage pulses are to be repeatedly applied between the anode and target 12 with the duty cycle within the range from 0.5% to about 10%. Each dc voltage pulse is completely overlapped by a pulse of the high frequency signal delivered to the pedestal 28. Thus, the high frequency signal will be repeatedly delivered to the pedestal 28 in pulses having a duty cycle within a range from around 2% to about 12%, so that delivery of the high frequency signal to the pedestal 28 begins before application of the dc voltage pulse and is discontinued subsequent to the removal of the dc voltage pulse.

It has been found that using this method and apparatus, very dense layers of tantalum can be applied to the through silicon vias having a high aspect ratio. This method was found to result in a desirable improvement of the uniformity of the coating of the side walls 14 by comparing thickness of the layer of the top portion compare to thickness of the layer in the bottom portion of the via 16 compared with conventional methods, as disclosed in U.S. Ser. No. 11/954,507.

In the following embodiments and examples, the metallization structure 1 was fabricated on 8-inch-diameter, oxidized silicon wafers of 725 μm thickness having a layer sequence of Ta/TaN/SiO$_2$/Si as illustrated in FIG. 1: TaN is first reactively sputtered on the substrate, in particular on a SiO$_2$ layer deposed on the substrate. Afterwards, alpha Ta is sputter deposited on the TaN layer.

The Ta/TaN structure was deposited by HIPIMS in a single substrate tool (a so-called Cluster tool) with a rotating magnet array under the following conditions:
Target: Ta
Target diameter: 300 mm
Target/substrate distance: 50 mm
Target area: 700 cm$^2$ Several processes with a relative wide range of process parameters as summarized in Table 1 were investigated.

For the TaN seed layer, the ranges of the conditions investigated were:
Sputtering Time: 1-15 s, Thickness: 0.2-20 nm, Uset: 550-1000V, Pavg: 1-8 kW, Frequency: 250-500 Hz, Pulse Length: 20-200 μs, Pulse Peak Current: 70-600 A, RF-Bias: 0-300V, N$_2$-Flow: 45-100 sccm, Ar-Flow: 30-150 sccm, Ar Backgas Flow: 5-12 sccm.

For the Ta layer, the ranges of the conditions investigated were:
Sputtering Time: 80-195 s, Thickness: 600 nm, Uset: 550-1000V, Pavg: 7.8-18.5 kW, Frequency: 250-500 Hz, Pulse Length: 60-200 μs, Pulse Peak Current: 300-1250 A, RF-Bias: 20-300V, N$_2$-Flow: 0 sccm, Ar-Flow: 30-150 sccm, Ar Backgas Flow: 5-12 sccm.

The specific resistivity of the samples was measured to lie in the range of 18-28μΩcm.

For all of the conditions investigated, intentional additional substrate heating was not required in order to obtain the alpha phase. In some embodiments, the substrates were even cooled by a 5-12 sccm Ar backgas flow. Therefore the danger of damaging temperature-sensitive dielectric materials is avoided.

Figure 5:
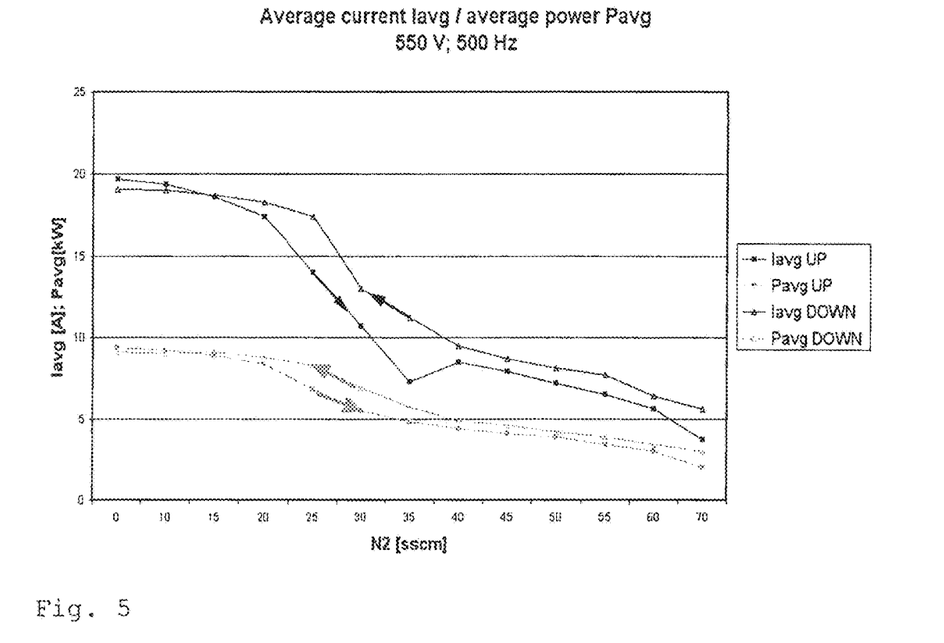
FIG. 5 illustrates the hysteresis of the average power and current when adding nitrogen.
Figure 6:
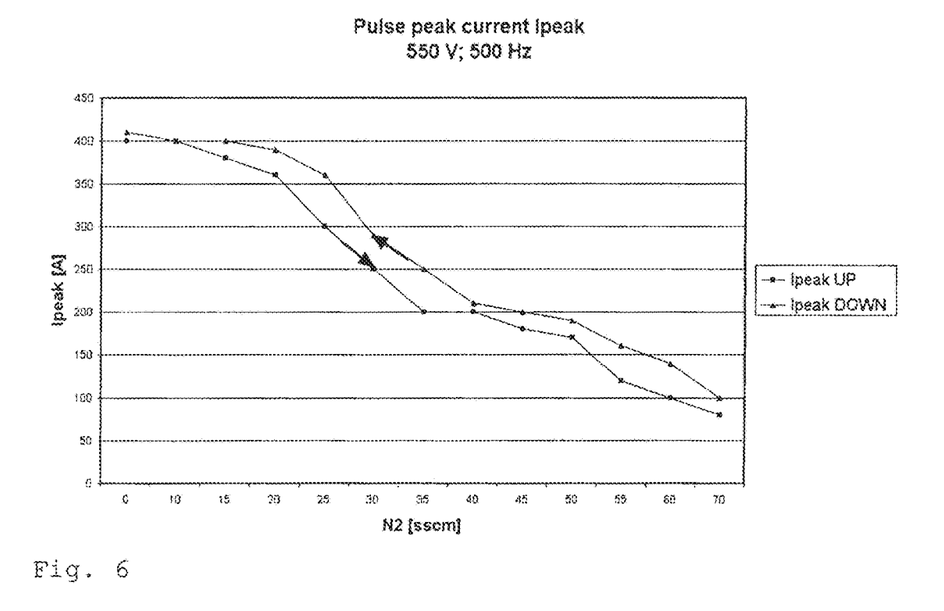
FIG. 6 illustrates the hysteresis of the HIPIMS pulse peak current when adding nitrogen.

The hysteresis when Ta is sputtered while adding nitrogen is typically very small. This could also be seen for the HIPIMS process. In FIG. 5 and FIG. 6 average power/average current and pulse peak current, respectively, are plotted as the flow of nitrogen is increased and decreased. In this particular example, the voltage is set to a constant value of 550 V. FIGS. 5 and 6 illustrate that there is a relationship between the nitrogen flow rate and the average power, average current and pulse peak current. For higher flow rates, the average power, average current and pulse peak current increases. In this way, the deposition rate can be controlled by changing the flow of nitrogen instead of changing the voltage applied to the target.

First, a TaN seed layer is deposited by reactive sputtering. If the Ta is sputtered directly onto the substrate it grows in the crystallographic beta phase. Upon the seed layer alpha Ta is sputtered, also by HIPIMS.

The presence of alpha-Ta or beta-Ta in the deposited films was investigated in two ways.

Due to the large change in resistivity between the alpha and the beta phases, the main measurement technique used was sheet resistivity. The specific resistivity was determined by using a four-point probe mapping system to measure the resistance of the film and a step profiler to measure the thickness of the film. The films deposited by the method described herein were found, typically, to have a resistivity within the range of 18 to 28 μΩcm, which indicates that Ta has been deposited in the alpha phase.

Secondly, X-ray diffraction (XRD) technique was used to verify the crystallographic phase formed. X-ray diffraction peaks of our samples are located at alpha Ta diffraction peak positions.

For some samples, the existence of alpha Ta has also been confirmed by nanodiffraction in transmission electron microscopy.

Figure 7:
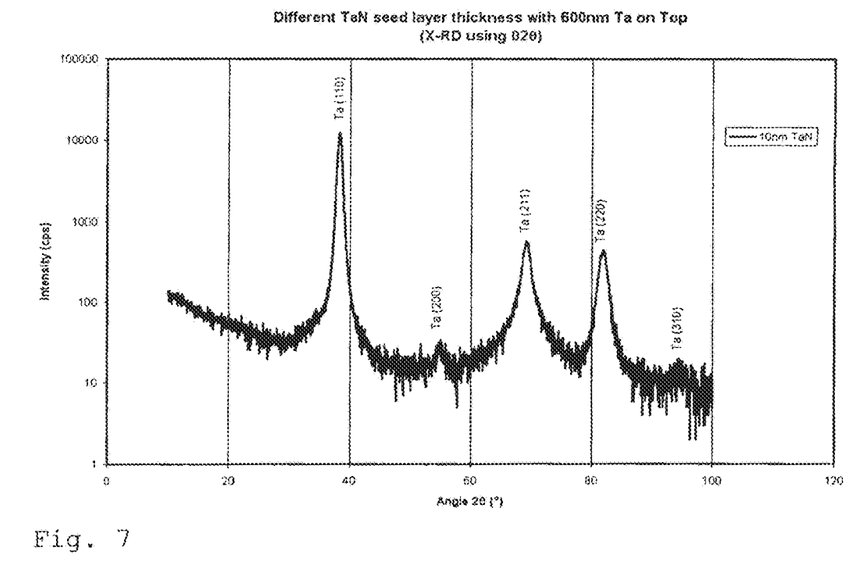
FIG. 7 illustrates a theta-2 theta XRD pattern of a 600 nm Ta film deposited on a 10 nm TaN seed layer

FIG. 7 illustrates a theta-2 theta XRD pattern taken for a silicon wafer including a 600 nm Ta film deposited onto a 10 nm TaN seed layer. The peaks can be indexed as tantalum having a bcc or alpha structure.

Figure 8:
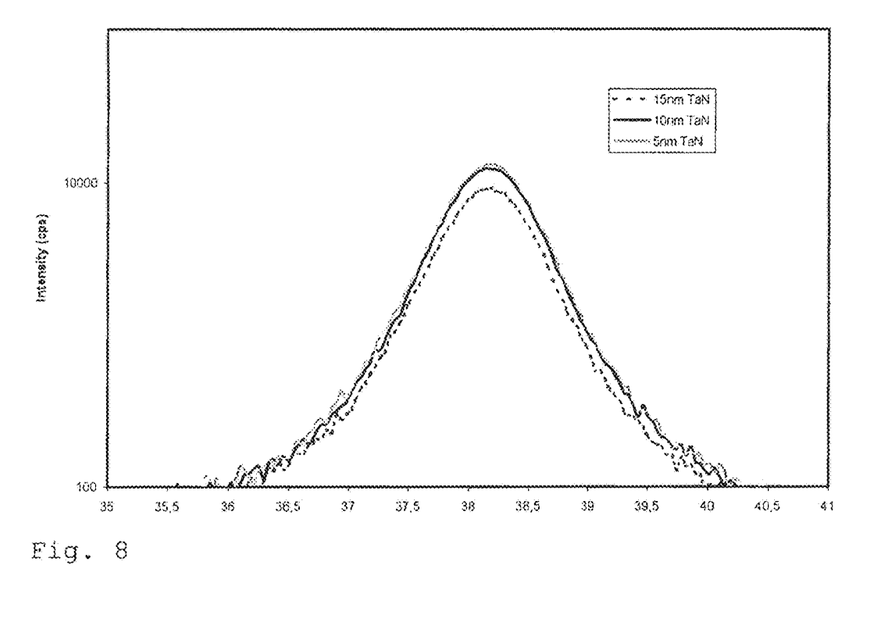
FIG. 8 illustrates a detailed view of FIG. 7.

FIG. 8 illustrates a detailed view of a portion of FIG. 7. FIG. 8 illustrates a comparison of the (1 1 0) peak measured for a 600 nm Ta film deposited on three different TaN seed layers of various thicknesses, in particular with a thickness of 5, 10, and 15 nm. The peak intensity is highest for the lowest TaN seed layer thickness of 5 nm TaN and lowest for 15 nm TaN.

Figure 9:
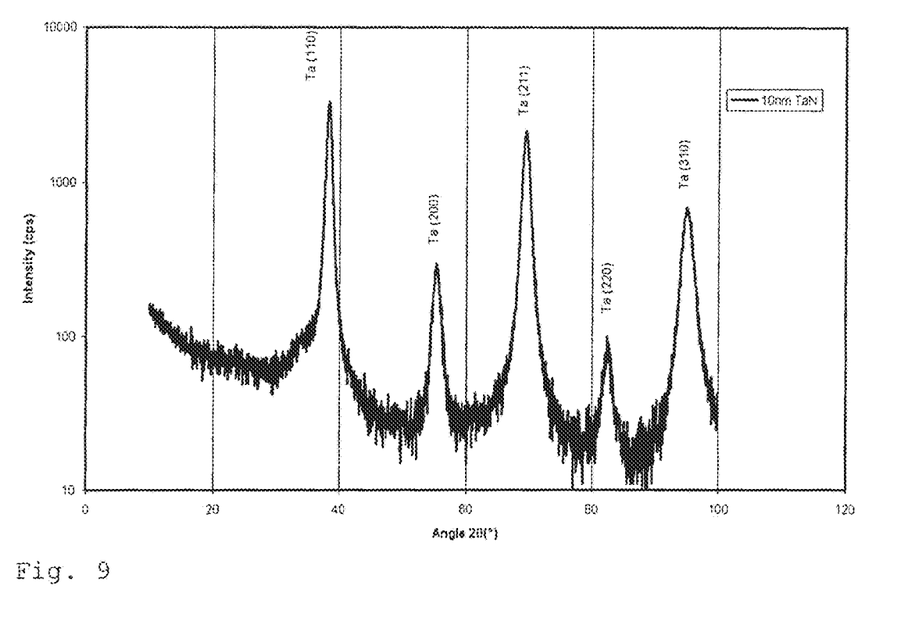
FIG. 9 illustrates a XRD pattern of a 600 nm Ta film deposited on a 10 nm TaN seed layer (XRD using Grazing incidence diffraction)

FIG. 9 illustrates a XRD pattern obtained using Grazing incidence diffraction for a 600 nm Ta film deposited on a 10 nm TaN seed layer.

Figure 10:
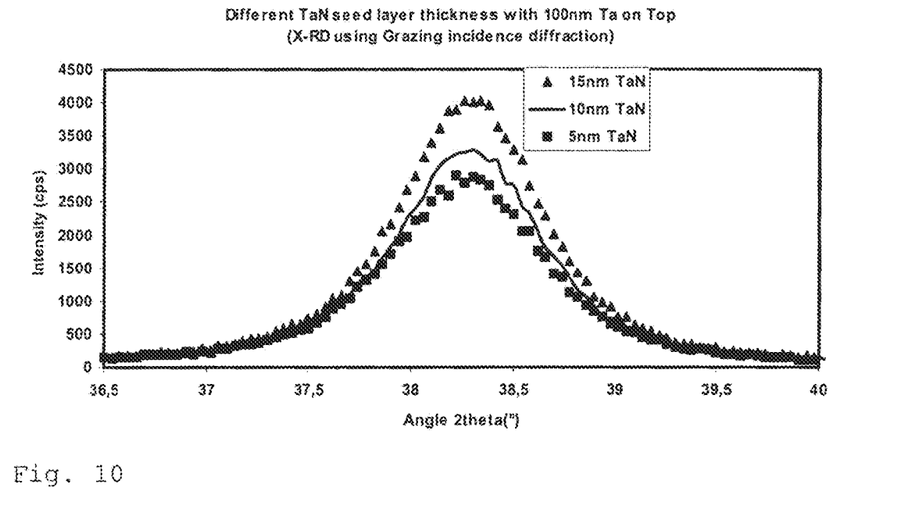
FIG. 10 illustrates a detailed view of FIG. 9.

FIG. 10 illustrates the (110) peak of FIG. 9 obtained from three 600 nm Ta films deposited on TaN layers having a thickness of 5 nm, 10 nm, and 15 nm.

The application of RF-bias during deposition of the TaN seed layer was found to influence the structure of the tantalum layer deposited on the TaN seed layer. It was found that if RF-bias was applied during deposition of the TaN seed layer, the proportion of the beta phase in the tantalum layer was observed to increase. If, however, the RF-bias was not applied during growth of the TaN seed layer, the proportion of the alpha-tantalum phase observed in the tantalum layer deposited on top was found to increase and the proportion of the beta-tantalum phase was found to decrease. This is illustrated for two embodiments in FIGS. 11 and 12.

Figure 11:
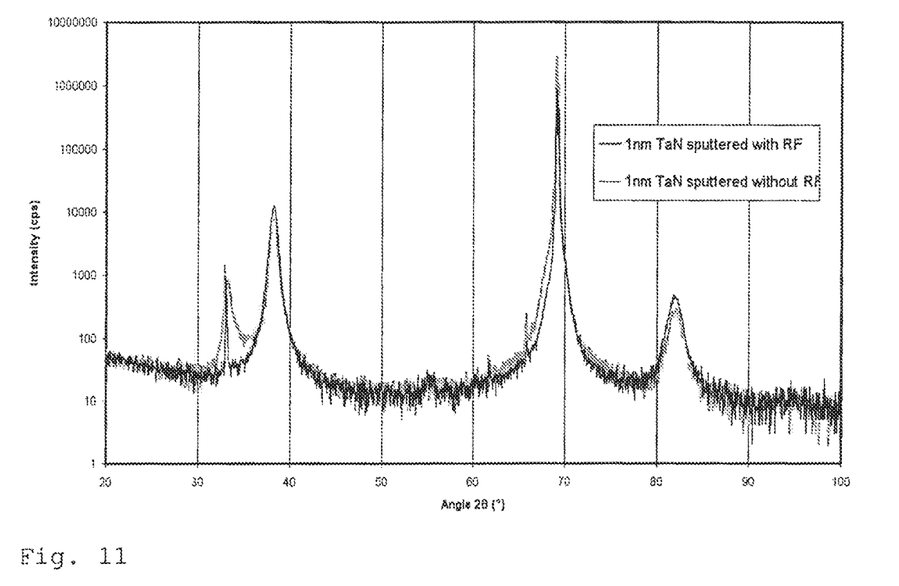
FIG. 11 illustrates a comparison of the XRD peaks of two different Ta layers, deposited on TaN seed layers deposited with and without applying an RF signal.
Figure 12:
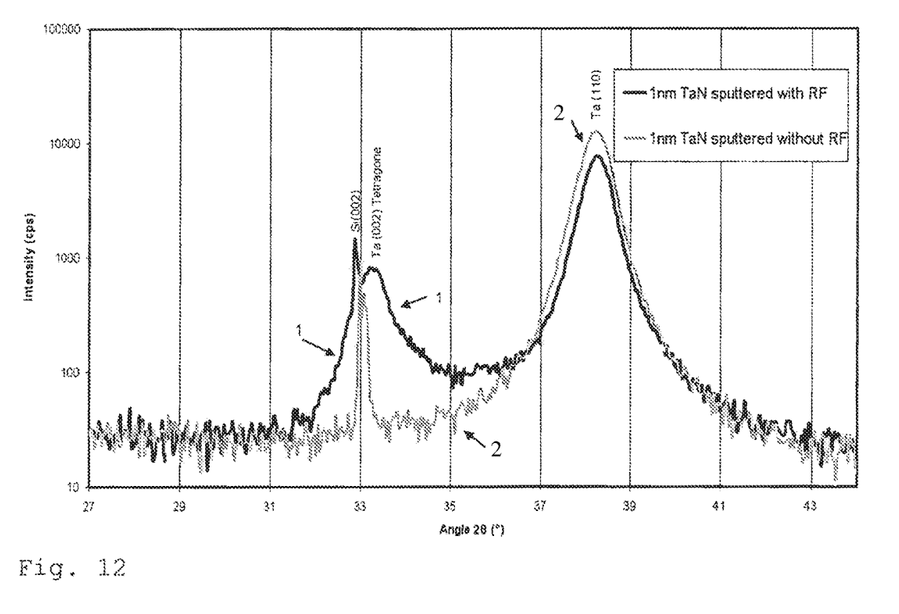
FIG. 12 illustrates a detailed view of FIG. 11 showing the formation of tetragonal (beta) Ta (Ta(002) peak at 2 theta=33.3°) when RF bias is applied during sputtering of the TaN seed layer.

When the seed layer is decreased to very thin dimensions, the application of RF-Bias during TaN seed layer deposition appears to initiate the partial growth of tetragonal beta Ta, or more particularly a mixture of alpha and beta phase on the seed layer. FIGS. 11 and 12 illustrate the partial growth of beta Ta in a Ta-film grown on a TaN seed layer which was deposited with a rf signal applied to the pedestal during its deposition by reactive sputtering.

FIG. 11 illustrates a comparison the theta-2 theta XRD patterns obtained for two different Ta layers, deposited on TaN seed layers with and without RF bias applied to the pedestal.

FIG. 12 illustrates a detailed view of a region of FIG. 11 indicating the formation of tetragonal (beta) Ta due to the emergence of the Ta(002) peak at 2 theta=33.3° when RF bias is applied during the deposition of the TaN seed layer. The underlying sharp peak comes from the Si substrate (Si(100)). The (002) peak is not observed in the film grown on a TaN seed layer which was deposited without applying a RF signal to the pedestal.

EXAMPLES

The following examples are intended to further illustrate the invention and are not intended to limit the scope of the invention in any manner.

Example 1

The process listed in table 2 was sputtered at a process pressure of $3.9 \times 10^{-6}$ bar. RF-Bias of 50 V was applied, although not required for the deposition of the TaN seed layer. The further deposition conditions are summarized in table 2.

Figure 13:
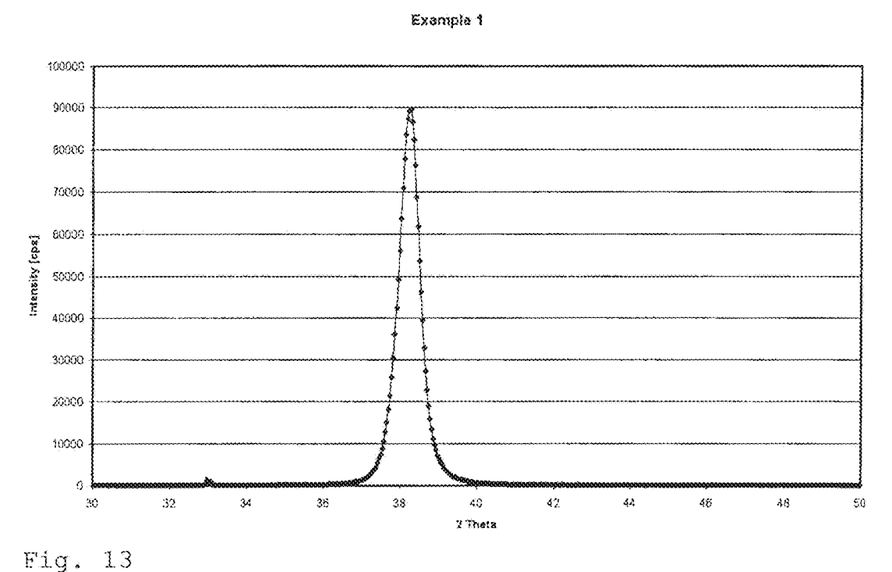
FIG. 13 illustrates an XRD pattern of (1 1 0) peak at 2 theta=38,472° indicating the alpha phase.

A specific resistivity of 23 μΩcm was measured by a four point-probe mapping system for this film. Together with the XRD peak at 2 theta=38.472° illustrated in FIG. 13 which can be assigned to the (1 1 0) peak of tantalum, the crystallographic phase of example 1 was characterized as the alpha (bcc) Ta.

Example 2

In the following example the TaN seed layer thickness was varied. If HIPIMS is used, the TaN seed layer can be reduced to a minimum of 0.2 nm. The deposition conditions are summarized in table 3.

For a 7.5 nm seed layer we sputtered 15 s with 500 Hz. By reducing the sputtering time to 10 s and 5 s we deposited TaN layers of 5 nm and 2.5 nm. In order to decrease the thickness to 1.25 nm the pulse frequency was halved from 500 Hz to 250 Hz by leaving the sputtering time at 5 s. We deposited a TaN layer of 0.5 nm by applying a flash of $N_2$ into the process chamber for with a pulse frequency of 500 Hz. Finally, a thickness of approximately 0.2 nm by sputtering for 2 s with a frequency of 250 Hz.

Figure 14:
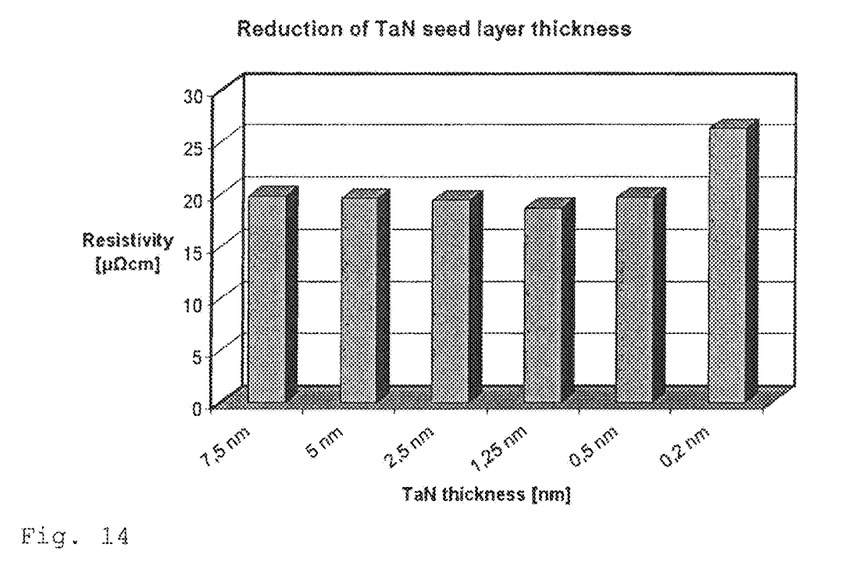
FIG. 14 illustrates the resistivity of 600 nm Alpha Ta layers grown on TaN seed layers of various thicknesses.

FIG. 14 illustrates the specific resistivity of 600 nm alpha-Ta layers deposited on different TaN seed layer thicknesses in the range 7.5 nm to 0.2 nm. For TaN seed layer thicknesses of 7.5 nm to 0.5 nm, the resistivity of the tantalum layer remained below 20 μΩcm. The resistivity of the tantalum layer increased slightly to just over 35 μΩcm for the layer deposited on a TaN seed layer with a thickness of 0.2 nm.

These processes have also been developed for growing alpha Ta without using RF-Bias for depositing the TaN seed layer. By applying an RF-Bias, accelerated ions can possibly damage structures and layers whereon the seed layer is being deposited. By applying HIPIMS instead of PVD no RF-Bias is needed to deposit the seed layer. Even with a 0.2 nm TaN seed layer for the deposition of alpha-Ta no RF-Bias was needed. As can be seen in FIG. 14, even with these very thin seed layers, alpha Ta is grown. Producing the first layers of the metallization without RF-Bias has the advantage of avoiding substrate and device damage.

In further embodiments, the power supply is applied to the target for a time period before the rf signal is applied to the pedestal. This enables a thin metallic layer to be deposited onto the substrate which acts as a shield and prevents damage to the substrate when the rf signal is applied. Once the rf signal is applied, it may be synchronized with the pulsed power supply applied to the target according to one of the embodiments previously described.

This method may be used to coat through-silicon vias with an aspect ratio of at least 10:1, for example. Here the sidewall and base coverage of the via is reduced significantly in vias with high aspect ratios so that a very thin TaN seed layer may enable the growth of alpha-Ta in the vias using the metallization structure and method according to one of the embodiments described herein. The method may also be used to fabricate a diffusion carrier structure for a multi-level rewiring structure of a semiconductor chip with integrated circuits.

The method according the embodiments described above enables a tantalum layer with a low resistivity to be deposited onto the TaN seed layer. The tantalum layer may consist of alpha-Ta, i.e. tantalum with a body centered cubic (bcc) structure which has a low resistivity, or may comprise at least 95 vol % of alpha-Ta. In an embodiment, the tantalum layer comprises less than 20 vol % or less than 10 vol. % of the tantalum phase having a tetragonal crystal structure, also denoted beta-Ta, and a higher resistivity. Furthermore, the use of a high current, low duty cycle pulsed sputtering technique to deposit the TaN layer enables the thickness of the layer to be reduced so that the metallization structure as a whole can be more quickly and cost-effectively fabricated whilst providing a metallization structure with a low resistivity.

The power supply may be a DC power supply which applies a plurality of pulses of a DC voltage across the anode and the cathode. As previously described, the pulses of the DC voltage are applied with a frequency in the range 10 Hz to 1000 Hz, with a duty cycle of between 0.01% and 20% and produce a current density of between 0.1 $A/cm^2$ and 10 $A/cm^2$ on the target.

In one embodiment, the high-frequency signal is not applied to the pedestal during deposition of the TaN seed layer. This method encourages a further reduction in the formation of beta-Ta, that is tantalum having a tetragonal crystal structure, and an increase in the formation of alpha-Ta in the subsequently deposited Ta-layer and a further decrease in the resistivity of the metallization structure.

In an embodiment, the high-frequency signal is synchronized with the pulses of said power supply. This further improves the coverage of features on the substrate having a high aspect ratio.

In an embodiment, to the Ta layer onto the TaN layer, the power supply is applied between the anode and cathode before the high-frequency (rf) signal is first applied to the pedestal. This enables a thin metallic layer to be deposited on the substrate before the rf signal is applied to the pedestal. The thin metallic layer acts as a shield and can prevent or at least reduce damage to the substrate which may occur as a result of the rf signal.

In one embodiment, during deposition of the Ta layer, the high-frequency signal is initiated before each pulse of the power supply is applied between the anode and the cathode. The high-frequency signal is then maintained while the power supply is applied between the anode and the cathode and for a period of time after the pulse of power supply between the anode and the cathode is terminated. The high-frequency signal is terminated only after expiration of a period of time after the pulse of power supply between the anode and the cathode is terminated.

This method has been found to lead to an improvement in the deposition rate of the Ta layer as well as enabling a more uniform coverage of three-dimensional structures such as vias with a high aspect ratio.

The high-frequency signal may have a frequency within a range of about 1 MHz to about 70 MHz. The high-frequency signal may be provided by a power source which supplies a signal of a single high-frequency. The power source may also be tunable. For example, a high-frequency power source may be used which supplies a signal of 13 MHz and which is also tunable in the range 12 MHz to 14 MHz.

The pulses of the power supply may have a frequency, or in other words a pulse repetition rate, in the range 200 Hz to 600 Hz during deposition of the TaN layer and/or the Ta layer. The same pulse repetition rate may be used to deposit both the TaN layer and the Ta layer. Alternatively, different pulse repetition rates may be used for the TaN layer and the Ta layer.

In an embodiment, the substrate is a semiconductor wafer, for example a silicon wafer. In some embodiments, the substrate includes at least one via and inner surfaces of the via are coated with the TaN layer and the Ta layer. The via may have an aspect ratio of at least 10:1 since the method enables the inner surfaces of a via with such a high aspect ratio to be reliably coated with the TaN and Ta layers.

The via may extend through the body of the substrate and may be a through silicon via. Such a via may be provided in silicon substrates, such silicon chips or integrated circuit devices, which are to be vertically stacked on top of one another.

In a further embodiment, the via forms a portion of a rewiring structure arranged on a planar surface of the substrate. The rewiring structure may be a multi-level rewiring structure which includes a number of interleaved dielectric and electrically conductive layers. The dielectric layers may include one or more vias so as to lead the electrically conductive interconnect structure outwards from the integrated circuits of the semiconductor substrate to the outermost metallization layer which typically provides contact pads.

The alpha-tantalum phase may be deposited without the use of additional heating of the substrate during deposition of the Ta-layer and without the use of post-deposition annealing. This has the advantage that damage to the substrate caused by high temperatures can be avoided. In one embodiment, the substrate is cooled during deposition of at least one of the TaN seed layer and the tantalum layer so as to further reduce the risk of damage to the substrate. A gas flow, for example of the sputtering gas or an inert gas such as argon, may be applied to the rear of the substrate to provide cooling of the substrate.

The thickness of the TaN layer may be adjusted by adjusting at least one of the frequency, the duration of the power supply pulse and the total deposition time so that the TaN layer has a thickness of less than 5 nm or less than 1 nm or around 0.2 nm.

In a further embodiment, copper is deposited onto the Ta layer. Copper may be deposited using sputtering and/or other techniques such as electro-deposition. In the case of electro-deposition, a copper seed layer may be deposited first using a vapour deposition technique such as sputtering.

Synchronizing the pulses of the first power supply applied across the anode and the target with the high-frequency signal applied to the pedestal with one another may improve the coverage of features on the substrate having a high aspect ratio over a method in which the first power supply applied across the anode and the target without applying the high-frequency signal applied to the pedestal as well as over a method in which the pulses of the first power supply applied across the anode and the target are not synchronized with the high-frequency signal applied to the pedestal. The apparatus is, therefore, particularly suitable for the deposition of coatings, such as a diffusion barrier layers, onto the inner surfaces of vias and onto the inner surfaces of vias having a high aspect ratio, for example, an aspect ratio of at least 10:1.

In an embodiment of the apparatus, the magnet assembly comprises a plurality of magnets which may be rotatable. The magnetic assembly may also comprise an electromagnet for providing a magnetic field adjacent to a surface of the target.

In an embodiment, the first power supply is a DC power supply which supplies a DC voltage across the anode and the target in a plurality of pulses with a frequency in the range 10 Hz to 1000 Hz, preferably 200 Hz to 600 Hz, a duty cycle of between 0.01% and 20% and produce a current density of between 0.1 A/cm$^2$ and 10 A/cm$^2$ on the target. The pulse repetition frequency of the first power supply may be adjustable.

In a further embodiment, the apparatus for sputtering further comprises means for tuning the high-frequency signal applied to the pedestal. For example, the high-frequency signal may have a frequency of 13 MHz and may be tunable within the range 12 MHz and 14 MHz.

The apparatus may further comprise means for initiating the high-frequency signal before each pulse of the first power supply is applied between the anode and the cathode, maintaining the high-frequency signal while the first power supply is applied between the anode and the cathode and for a period of time after the pulse of first power supply between the anode and the cathode is terminated, and terminating the high-frequency signal only after expiration of a period of time after the pulse of the first power supply between the anode and the cathode is terminated.

TABLE 1

|  | Sputtering Time [s] | Thickness [nm] | Uset [V] | Pavg [kW] | Frequency [Hz] | Pulse Length [μs] | Pulse Peak Current [A] | RF-Bias [V] | N2-Flow [sccm] | Ar-Flow [sccm] | Ar Backgas Flow [sccm] | Specific Resistivity [μΩcm] |
|---|---|---|---|---|---|---|---|---|---|---|---|---|
| TaN | 1-15 | 0.2-20 | 550-1000 | 1-8 | 250-500 | 20-200 | 70-600 | 0-300 | 45-100 | 30-150 | 5-12 | 18-28 |
| Ta | 80-195 | 600 | 550-1000 | 7.8-18.5 | 250-500 | 60-200 | 300-1250 | 20-300 | 0 | 30-150 | 5-12 |  |

TABLE 2

|  | Sputtering Time [s] | Thickness [nm] | Uset [V] | Pavg [kW] | Frequency [Hz] | Pulse Length [μs] | Pulse Peak Current [A] | RF-Bias [V] | N2-Flow [sccm] | Ar-Flow [sccm] | Ar Backgas Flow [sccm] | Specific Resistivity [μΩcm] |
|---|---|---|---|---|---|---|---|---|---|---|---|---|
| TaN | 15 | 19 | 550 | 5.1 | 500 | 200 | 100 | 50 | 70 | 100 | 12 | 23 |
| Ta | 195 | 580 | 550 | 9.5 | 500 | 200 | 380 | 200 | 0 | 100 | 12 |  |

TABLE 3

|  | Sputtering Time [s] | Thickness [nm] | Uset [V] | Pavg [kW] | Frequency [Hz] | Pulse Length [μs] | Pulse Peak Current [A] | RF-Bias [V] | N2-Flow [sccm] | Ar-Flow [sccm] | Ar Backgas Flow [sccm] | Specific Resistivity [μΩcm] |
|---|---|---|---|---|---|---|---|---|---|---|---|---|
| TaN | 2 | 0.2 | 550 | 2.6 | 250 | 200 | 80 | 0 | 70 | 100 | 12 | 26 |
| Ta | 32 | 100 | 550 | 10 | 500 | 200 | 400 | 110 | 0 | 100 | 12 |  |

What is claimed is:

1. Apparatus for sputtering, comprising:
a pedestal for supporting a substrate during sputtering,
at least one target formed at least in part from electrically conductive material to be sputtered onto the substrate wherein the pedestal and the target are at least partially located inside a chamber of a reactor housing,
a magnetic assembly for providing a magnetic field adjacent to a surface of the target,
a first power supply for applying a plurality of pulses between an anode and a cathode, the cathode including the target, the pulses having a frequency in the range 10 Hz to 1000 Hz, a duty cycle of between 0.01% and 20% and producing a current density of between 0.1 A/cm2 and 10 A/cm2 on the target,
an inert gas source to supply an inert gas to the inside of the chamber of the reactor housing,
a reactive gas source to supply a reactive gas to the inside of the chamber of the reactor housing,
a second power source electrically connected to the pedestal for applying a high-frequency signal to a pedestal supporting the substrate to generate a self bias field adjacent the substrate, wherein the high-frequency signal has a frequency within a range of 1 MHz to 70 MHz,
a synchronization unit for synchronizing the pulses of the first power supply with the high-frequency signal applied to the pedestal in such a way that the high frequency signal is initiated before each pulse of the first power supply is applied between the anode and the cathode, the high-frequency signal is maintained while the first power supply is applied between the anode and the cathode and for a period of time after the pulse of first power supply between the anode and the cathode is terminated, and the high-frequency signal is terminated only after expiration of a period of time after the pulse of the first power supply between the anode and the cathode is terminated.

2. Apparatus according to claim 1, wherein the magnet assembly comprises a plurality of magnets.

3. Apparatus according to claim 2, wherein the magnets of the magnet assembly are rotatable.

4. Apparatus according to claim 1, wherein the first power supply is a DC power supply.

5. Apparatus according to claim 1, wherein the pulse repetition frequency of the first power supply is adjustable.

6. Apparatus according to claim 1, further comprising means for tuning the high-frequency signal applied to the pedestal.

7. Apparatus according to claim 1, wherein the reactive gas comprises nitrogen.

* * * * *

UNITED STATES PATENT AND TRADEMARK OFFICE
CERTIFICATE OF CORRECTION

PATENT NO. : 9,644,261 B2  
APPLICATION NO. : 14/181886  
DATED : May 9, 2017  
INVENTOR(S) : Juergen Weichart et al.

Page 1 of 1

It is certified that error appears in the above-identified patent and that said Letters Patent is hereby corrected as shown below:

In the Specification

Column 7, Line 11, replace "$I_x$" with -- $I_{DC}$ --.

Signed and Sealed this  
Fifteenth Day of August, 2017

Joseph Matal  
*Performing the Functions and Duties of the*  
*Under Secretary of Commerce for Intellectual Property and*  
*Director of the United States Patent and Trademark Office*